United States Patent
Wakada et al.

(10) Patent No.: US 6,522,711 B2
(45) Date of Patent: Feb. 18, 2003

(54) VARIABLE FREQUENCY DIVIDER CIRCUIT

(75) Inventors: Hideyuki Wakada, Hyogo (JP); Naoyuki Kato, Hyogo (JP); Hisayasu Satoh, Hyogo (JP); Hiroshi Komurasaki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/961,184

(22) Filed: Sep. 24, 2001

(65) Prior Publication Data

US 2002/0097072 A1 Jul. 25, 2002

(30) Foreign Application Priority Data

Jan. 19, 2001 (JP) ........................ 2001-011147

(51) Int. Cl.[7] .............................................. H03K 21/00
(52) U.S. Cl. ........................................... 377/48; 377/47
(58) Field of Search ..................................... 377/47, 48

(56) References Cited

U.S. PATENT DOCUMENTS 4,659,949 A * 4/1987 Okanobu .................... 307/511

FOREIGN PATENT DOCUMENTS

JP          4-103220          4/1992

* cited by examiner

*Primary Examiner*—Margaret R. Wambach
(74) *Attorney, Agent, or Firm*—McDermott, Will & Emery

(57) ABSTRACT

In a variable frequency divider formed of a latch train, a frequency division ratio is set through selective invalidating a feedback signal to a first stage latch from the last stage latch. A size of MOS (metal-insulator-semiconductor) transistors for switching the division ratio is made larger than that of other MOS transistors in differential stages in the last stage latch circuit. Further, differential signals are transmitted as feedback signals to the first stage latch circuit. A F/(F+1) prescaler which operates stably with a low current consumption under a low power supply voltage condition is implemented.

13 Claims, 9 Drawing Sheets

VARIABLE FREQUENCY DIVIDER CIRCUIT

BACKGROUND OF THE INVENTION

1. Field of the Invention

The present invention relates to a variable frequency divider circuit, and in particular, to a structure of a variable frequency divider circuit capable of changing its division ratio between F and F+1 with F being a natural number. Specifically, the present invention relates to a high-speed frequency divider (prescaler) circuit formed through. CMOS process.

2. Description of the Background Art

In recent years, the miniaturization of components in the CMOS (complementary metal-insulating film-semiconductor) process is progressed, to make it possible to manufacture a circuit for processing RF (radio frequency) band signals, which operates at a GHz (giga-hertz) speed, such as a PLL (phase locked loop) synthesizer.

FIG. 13 is a diagram representing a conventional high-speed frequency divider. FIG. 13 shows, as one example of high-speed frequency dividers, the structure of a prescaler in which its frequency division ratio can be changed between 1/4 and 1/5. When the frequency division ratio of the prescaler is 1/F, the frequency of the output signal thereof is 1/F times that of an input signal.

In FIG. 13, the prescaler includes three cascaded flip-flops 1–3. In the flip-flops 2 and 3, their output signals FBA and FBB are fed back to the first stage flip-flop 1. Complementary output signals OUT and OUTB are outputted through output terminals 9 and 10 from the first stage flip-flop 1. Each of the flip-flops 1–3 performs transfer/latch operation of the feedback signals FBA and FBB in accordance with complementary input signals ZIN and IN applied to terminals 6 and 7 to generate frequency-divided signals OUT and OUTB of the input signals IN and ZIN.

The flip-flop 1 includes two cascaded latch circuits LT1 and LT2 performing transfer/latch operation complementarily to each other in accordance with the input signals IN and ZIN. The latch circuit LT1 includes: resistance elements 11a and 11b, each connected, at one end thereof, connected to a power node; N channel MOS transistors 16 and 17 each having a drain connected to the other end of the resistance element 11a and a gate receiving the feedback signal FBB, FBA; and an N channel MOS transistor 18 having a drain connected to the resistance element 11b and having a gate receiving a reference voltage Vr supplied through a terminal 5. The sources of these MOS transistors 16–18 are connected together.

The latch circuit LT1 further includes: an N channel MOS transistor 12 having a drain connected to a common source node of the MOS transistors 16–18, and a gate receiving the input signal IN supplied through a terminal 7; an N channel MOS transistor 19 having a drain connected to the common drain node of the MOS transistors 16 and 17, and a gate connected to the drain of the MOS transistor 18; an N channel MOS transistor 20 having a drain connected to the drain of the MOS transistor 18, a gate connected to the common drain node of the MOS transistors 16 and 17, and a source connected to the source of the MOS transistors 19; an N channel MOS transistor 13 having a drain connected to the common source node of the MOS transistors 19 and 20, a source connected to the source of the MOS transistor 12, and a gate receiving the complementary input signal ZIN supplied through a terminal 6; and an N channel MOS transistor 4 connected between the common source node of the MOS transistors 12 and 13 and a ground node and having a gate receiving a constant voltage Vc supplied through a terminal 8.

The MOS transistor 4 functions as a current source transistor and had its supplying current determined by the constant voltage Vc supplied to the gate thereof. The MOS transistors 12 and 13 conduct the current complementarily in accordance with the input signals IN and ZIN. The sources of the MOS transistors 16–18 are connected together, and a current flows through the MOS transistor receiving the highest gate voltage. The circuit.structure in which a MOS transistor receiving the highest gate voltage among MOS transistors having their sources connected together, flows substantially all the current as described above is referred to as a "source coupled logic" hereinafter.

The reference voltage Vr supplied to the MOS transistor 18 is set to a criterion voltage level for determining the H level and the L level of the feedback signals FBB and FBA supplied to the gates of the MOS transistors 16 and 17, and is normally set to a middle voltage level between the H and L voltage levels.

The MOS transistors 19 and 20 constitute a "source coupled logic" when the MOS transistor 13 is made conductive, and latch the output signals of the MOS transistors 16–18 due to the structure that their gates and drains are cross-coupled.

Similarly to the latch circuit LT1, the latch circuit LT2 includes: resistance elements 11c and 11d each having one end connected to the power node; an N channel MOS transistor 21 having a drain connected to the other end of the resistance element 11c and a gate connected to the drains of the MOS transistors 18 and 20; an N channel MOS transistor 22 having a drain connected to the other end of the resistance element 11d, a gate connected to the drains of the MOS transistors 16, 17 and 19, and a source connected to the source of the MOS transistor 21; an N channel MOS transistor 14 having a drain connected to the common source node of the MOS transistors 21 and 22 and a gate receiving the input signal ZIN applied from the terminal 6; an N channel MOS transistor 23 having a drain connected to the drain of the MOS transistor 21 and a gate connected to the drains of the MOS transistors 22 and 24; an N channel MOS transistor 24 having a drain connected to the drain of the MOS transistor 22, a gate connected to the drains of the MOS transistors 21 and 23, and a source connected to the source of the MOS transistor 23; an N channel MOS transistor 15 having a drain connected to the common source node of the MOS transistors 23 and 24, a source connected to the source of the MOS transistor 14 and a gate receiving the input signal IN; and a current source N channel MOS transistor 4b connected between the common source node of the MOS transistors 14 and 15 and the ground node and having a gate receiving the constant voltage Vc supplied through the terminal 8.

MOS transistors 23 and 24 have their gates and drains cross-coupled, to latch output signals of the MOS transistors 21 and 22 when the MOS transistors 23 and 24 are active.

This latch circuit LT2 takes in complementary output signals of the latch circuit LT1 when the input signal ZIN is at an H level, and latches the complementary signals when the input signal IN turns into an H level. Accordingly, the latch circuit LT2 transfers the output signals of the latch circuit LT1 with delay of a half of one cycle of the input signal IN, to output the signals to the output terminals 9 and 10.

The flip-flop 2 also includes two cascaded latch circuits LT3 and LT4 to perform transfer/latch operation complementarily to each other in response to the input signals IN and ZIN. The latch circuits LT3 and LT4 in this flip-flop 2 have the same structure as the latch circuit LT2. In accordance with the input signals IN and ZIN, the latch circuits LT3 and LT4 transfer and latch the complementary output signals (actual output signals OUT and OUTB of the frequency divider) of the latch circuit LT2.

The flip-flop 3 also includes latch circuits LT5 and LT6 to perform transfer/latch operation complementarily to each other in response to the input signals IN and ZIN. The latch circuits LT5 has the same structure as the latch circuits LT2–LT4 have. This latch circuit LT5 takes in complementary output signals of the latch circuit LT4 in the flip-flop 2 when the input signal ZIN is at an H level, and latches the complementary signals when the input signal IN turns into an L level.

The latch circuit LT6 at the last stage is further provided with components for changing the frequency division ratio. Specifically, the latch circuit LT6 includes: resistance elements 11e and 11f for pulling up output signals; N channel MOS transistors 31 and 30 constituting a differential stage, and connected to the respective resistance elements 11e and 11f and having gates receiving the complementary output signals of the latch circuit LT5, respectively; a resistance element 36 connected to the common source node of the MOS transistors 30 and 31; an N channel MOS transistor 41 having a drain connected to the resistance element 36 and a gate receiving the input signal ZIN from the terminal 6; N channel MOS transistors 28 and 29 for latching drain voltages of the MOS transistors 31 and 30; a resistance element 37 connected to the common source node of the MOS transistors 28 and 29; an N channel MOS transistor 42 connected to the resistance element 37 in series and having a gate receiving the input signal IN; and an N channel MOS transistor 4c connected between the common source node of the MOS transistors 41 and 42 and the ground node, and having a gate receiving the constant voltage Vc.

The gates of the N channel MOS transistors 28 and 29 are connected to the drains of the MOS transistors 31 and 30, respectively. The drains of the MOS transistors 28 and 29 are connected to the drains of the MOS transistors 30 and 31, respectively. Thus, the transistors 28 and 29 drive the output nodes thereof in accordance with the complementary output signals of the latch circuit LT6. The feedback signal FBB is outputted from the common drain node of the MOS transistors 29 and 31.

The MOS transistor 4c receives the constant voltage Vc at a gate thereof to operate as a constant current source transistor. Therefore, the operating current of this latch circuit LT6 is determined by the constant voltage Vc.

The latch circuit LT6 is further provided N channel MOS transistors 25 and 26 for stopping the transfer/latch operation of the latch circuit LT6 when rendered conductive. N channel MOS transistor 25 has its drain connected to the drains of the N channel MOS transistors 29 and 31, and its source connected to a connection node between the resistance element 36 and the MOS transistor 41. N channel MOS transistor 26 has its drain connected to the drains of the MOS transistors 29 and 31, and its source connected to a connection node between the resistance element 37 and the MOS transistor 42.

These MOS transistors 25–31 have the same size (the ratio of the channel width to the channel length), so that they have the same current supplying capability when their gate voltages are the same. The resistance elements 36 and 37 are provided in order to reliably render the MOS transistors 25 and 26 conductive, regardless of the voltage level of the input signals of the latch circuit LT6, when the MOS transistors 25 and 26 are rendered conductive. The resistance elements 36 and 37 make the source voltage of the MOS transistors 28–31 higher than that of the MOS transistors 25 and 26. MOS transistors 25 and 26 have the gate to source voltage thereof made larger than those of the MOS transistors 28–31, when made conductive. Accordingly, the current surely flows through the MOS transistors 25 and 26 in this state.

The output signal of the latch circuit LT4 is applied as the feedback signal FBA to the gate of the MOS transistor 17 in the latch circuit LT1. The output signal of the latch circuit LT6 is applied as the feedback signal FBB to the gate of the MOS transistor 16 in the latch circuit LT1. Now, the operation of the frequency divider shown in FIG. 13 will be described in the following, referring to FIGS. 14 and 15.

First, referring to FIG. 14, the operation in the case that a division ratio switching signal SEL is set to an H level, will be described.

When the division ratio switching signal SEL is set to an H level, the voltage at the H level of the signal SEL is a higher voltage level (for example, a power supply voltage VDD) than the voltage level of the output signals of the latch circuit LT5. When the input signal IN is at an L level and the input signal ZIN is at an H level, the MOS transistors 41 and 42 are on and off, respectively. Therefore, comparing operation is performed by the MOS transistors 25, 30 and 31. The resistance element 36 is connected to the sources of the MOS transistors 30 and 31. Thus, even if the gate voltage at one of these MOS transistors 30 and 31 attains an H level by the output signal of the latch circuit LT5, its gate to source voltage Vgs is lower than the gate to source voltage of the MOS transistors 25. Accordingly, substantially all the current is supplied to the MOS transistor 41 through the MOS transistor 25. Thus, the voltage level of the drain of the MOS transistor 31 is set to an L level so that the feedback signal FBB is set to an L level.

When the input signal IN is at an H level, the MOS transistor 42 turns on so that the circuit formed of the MOS transistors 26, 28 and 29 operates. In this case, the gate to source voltage of the MOS transistor 26 is larger than the gate to source voltage of each of the MOS transistors 28 and 29 due to the resistance element 37. Similarly, substantially all the current flows through the MOS transistor 26, so that the drain voltage of the MOS transistor 29 attains an L level. Accordingly, when the division ratio switching signal SEL is set to an H level, current flows constantly through the MOS transistors 25 and 26, so that the feedback signal FBB is fixed to an L level.

In the flip-flop 1, the MOS transistors 16 and 17 in the latch circuit LT1 constitute an OR circuit. Therefore, when the gate voltage of the MOS transistor 16 is at an L level, current flows through either one of the MOS transistors 17 and 18 in accordance with the logic (voltage) level of the feedback signal FBA. Thus, a structure equivalent to the structure in which the flip-flops 1 and 2 are connected to each other through a feedback path is provided to implement 1/4 frequency-dividing operation.

Specifically, when the input signal IN is at an H level, current having a magnitude determined by the current source transistor 4a flows through the MOS transistor 12. When the voltage level of the feedback signal FBA is higher than the reference voltage Vr, current flows through MOS transistor 17 and current hardly flows through the MOS transistor 18, due to a source coupled logic structure. Therefore, output signal QA of the latch circuit LT1, the voltage at the drain node of the MOS transistor 18, attains an H level equal to the power supply voltage VDD. Conversely, when the feedback signal FBA is at an L level and is lower than the reference voltage Vr, current flows through the MOS transistor 18, so that the output signal QA of the latch circuit Lt1 attains an L level.

When the input signal IN attains an L level and the complementary signal attains an H level, the MOS transistor 12 is turned off and the MOS transistor 13 is turned on. The MOS transistors 19 and 20 compare the drain voltages of the MOS transistors 18 and 19 with each other, and drive the output signal QA in accordance with the result of comparison. When the output signal QA is at an H level, for example, current flows through the MOS transistor 19. On the other hand, the MOS transistor 20 maintains the off state, so that the output signal QA is kept at the H level. That is, the output signal QA of the latch circuit LT1 is latched by the MOS transistors 19 and 20.

When the output signal QA is at an L level, current flows through the MOS transistor 20 from the resistance element 11b having a predetermined resistance value, so that the output signal QA is kept at the L level. In other words, when the input signal IN is at an H level and the MOS transistor 12 is on, the feedback signal FBA is taken in the latch circuit LT. When the input signal ZIN attains an H level, the taken-in signal is latched by the MOS transistors 19 and 20.

In the latch LT2, the same operation is performed. The latch circuit LT1 takes in the complementary signals OUT and ZOUT in accordance with the input signal ZIN. Then, the input signal ZIN attains an H level so that a latch state is implemented. Specifically, when the input signal ZIN turns into an H level, current supplied through either one of the resistance elements 11c and 11d flows through either one of the MOS transistors 21 and 22. The drain voltages of these MOS transistors 21 and 22 are determined by the voltage level of the output signal QA of the latch circuit LT1. In this state, the MOS transistor 15 is off, and no current flows through the MOS transistors 23 and 24.

Thereafter, when the input signal ZIN turns into an L level, no current flows through the MOS transistors 21 and 22 so that the taking-in of the output signal of the latch circuit LT1 is stopped. On the other hand, the MOS transistor 15 turns on so that the cross-coupled differential stage composed of the MOS transistors 23 and 24 is activated. Responsively, the output signals OUT and OUTB of the latch circuit LT2 are latched.

In the flip-flop 1, therefore, the feedback signal FBA is taken into the latch circuit LT1 when the input signal IN is at an H level. When the input signal IN turns into an L level, this taken-in signal is latched in the flip-flop 1 and transferred to the latch circuit LT2 at the next stage. When the input signal IN turns into an L level and the complementary input signal ZIN turns into an H level, the output signal QA of the latch circuit LT1 is taken into the latch circuit LT2. Subsequently, when the complementary input signal ZIN turns into an L level, the taken-in output signal of the latch circuit LT1 is latched in the latch circuit LT2.

In other words, the latch circuits LT1 and LT2 perform transfer and latch operation complementarily to each other. As a whole, the flip-flop 1 takes in the feedback signal FBA in accordance with the input signal IN, and outputs this taken-in feedback signal after a half cycle of the input signal IN elapses.

In the flip-flop 2, in the same way, the latch circuits LT3 and LT4 perform transfer/latch operation in accordance with the input signals IN and ZIN. When the latch circuit LT2 is in a latch state, the latch circuit LT3 performs taking-in operation. When the latch circuit LT2 performs transfer operation (taking-in operation), the latch circuit LT3 is in a latch state. The latch circuit LT4 performs transfer/latch operation complementarily to the latch circuit LT3. Therefore, this flip-flop 2 outputs the output signal of the flip-flop 1 after a half cycle of the input signal IN elapses.

The flip-flops 1 and 2 cause the output signal OUT and the fed-back signal FBA each to change with delay of one cycle of the input signal IN from the change of the other. Specifically, the output signal OUT changes after one cycle of the input signal IN from the change of the feedback signal FBA. After one cycle of the input signal IN from the change of the output signal OUT, the feedback signal FBA changes. Therefore, each of the feedback signal FBA and the output signal OUT changes every time when two cycles of the input signal IN elapse. Thus, this output signal OUT has a period 4T which is four times as long as a period T of the input signal IN. That is, the frequency of the output signal OUT is one-fourth times that of the input signal IN, so that 1/4 frequency division is realized.

Now, the operation in the case that the division ratio switching signal SEL is set to an L level will be described in the following, referring to FIG. 15. L level of the division ratio switching signal SEL is such a voltage level that the MOS transistors 25 and 26 in the flip-flop 3 are kept off regardless of the voltage levels of the output signals of the latch circuit LT5 in the flip-flop 3. In this case, the MOS transistors 28–31 in the latch circuit LT5 turns on or off in accordance with the output signals of the latch circuit LT5. Therefore, the feedback signal FBB changes in accordance with the output signal of the latch circuit LT5.

When the input signal IN is at an H level, the MOS transistors 16 and 17 turn off when the feedback signals FBA and FBB are both at L level. Thus, current flows through the MOS transistor 18 so that the output signal QA of the latch circuit LT1 attains an L level. When the input signal ZIN turns into an H level, the latch circuit LT2 takes in and latches the output signal QA from the latch circuit LT1. Accordingly, the output signal OUT rises up to an H level in response to the rise of the complementary input signal ZIN. The output signal OUT is successively transferred to the latch circuits LT3 and LT4 in the flip-flop 2 in accordance with the input signal IN. The feedback signal FBA changes with delay of one cycle of the input signal IN in response to the output signal OUT.

When the feedback signal FBA attains an H level, the MOS transistor 17 turns on and no current flows through the MOS transistors 16 and 18. Therefore, when the input signal IN attains an H level, the output signal QA of this latch circuit LT1 turns to an H level so that the output signal OUT falls down to an L level in response to the next rise of the complementary input signal ZIN to an H level.

On the other hand, the feedback signal FBA outputted from the latch circuit LT4 in the flip-flop 2 is transferred to the latch circuits LT5 and LT6 in the flip-flop 3 in accordance with the input signals IN and ZIN. Therefore, the feedback signal FBB changes in response to the feedback signal FBA, with delay of one cycle of the input signal IN. Therefore, even if the feedback signal FBA is transitioned into an L level with delay of one cycle of the input signal IN from the transition of the output signal OUT to an L level, the feedback signal is at an H level. When the input signal IN turns into an H level in this state, the MOS transistor 16 is turned on and the MOS transistors 17 and 18 are turned off and the output signal QA of the latch circuit LT1 is maintained at the H level. That is, the H-level period of the output signal QA is made longer owing to this feedback signal FBB. Since the feedback signal FBB changes with delay of one cycle from the feedback signal FBA, the time period during which the output signal QA of the latch circuit LT1 is at the H level is made longer by one cycle of the input signal IN, as compared to the case when frequency 1/4-dividing operation is performed.

When the feedback signals FBA and FBB both turn into L levels, the output signal QA of the latch circuit LT1 attains an L level in response to the rise of the input signal IN to an H level. Thus, the output signal OUT turns into an H level after a half cycle of the input signal IN. The feedback signal FBA changes into an H level with delay of one cycle with respect to the output signal OUT. Consequently, the output signal QA of the latch circuit LT1 changes again from the L level to an H level.

Therefore, the H level period of the output signal OUT is equal to two cycles of the input signal IN and the L level period thereof is equal to three cycles of the input signal IN, so that the output signal OUT has a period 5T five times as long as the period T of the input signal IN.

In other words, by the flip-flop 3, the feedback signal FBB is transmitted to the first stage flip-flop with delay of one cycle of the input signal IN with respect to the feedback signal FBA. Thus, on the basis of the feedback signals FBA and FBB, current flows through one of the MOS transistors 16 and 17 so that the period during which the MOS transistor 18 is off becomes longer by one cycle of the input signal IN. Consequently, the cycle of the output signal OUT can be made longer. In this way, a frequency divider for performing frequency 1/5-dividing operation is realized.

As shown in FIG. 13, the flip-flops 1–3 can be operated at a high speed, owing to current driving, by using the "source coupled logic" composed of the differential transistors having their sources connected together to perform comparing operation and transferring a feedback signal in accordance with an input signal in the frequency divider. Thus, even if the input signal IN is a high-speed signal, accurate frequency division can be performed to generate a frequency divided signal having a desired division ratio.

For a frequency divider as described above, sub-micron processing can be achieved through a CMOS process. Thus, it is possible to make the size of transistor elements miniaturized, to implement a frequency divider operable at high speed with low power consumption. By using the "source coupled logic", high-speed operation can be achieved due to no need of full swing of the gate voltages of the differential transistors. By using, in a latching stage, the same structure as in input differential stages, the output signal having an intermediate voltage level of the differential stage can be reliably latched.

However, the feedback signals FBA and FBB each are a single end signal, and if they are small amplitude signals, such a problem arises that an influence of noises increases. H level of the feedback signals FBA and FBB is the level of the power supply voltage VDD and L level thereof is the level of the voltage VDD−R·Ib, wherein R represents the resistance value of the resistance elements 11 (11a–11f), and Ib represents the value of current flowing through the resistance elements 11 (11a–11f). Therefore, if the resistance value and/or the current value are made large, the amplitude of the feedback signals FBA and FBB can be made large.

However, in the case that the resistance values of the resistance elements 11a–11f are made large, the transition speed of the output signal becomes slow upon operation. Thus, it becomes impossible to realize a frequency divider that can operate at a high speed.

When the current Ib flowing through the resistance elements 11(11a–11f) is made large, current flows constantly through the current source transistors 4a–4c and 4, independent of whether the input signal IN is at an H level or at an L level, causing a problem of increased current dissipation.

In order to change the division ratio of this frequency divider in accordance with the division ratio switching signal SEL, the MOS transistors 25 and 26 are used. These MOS transistors 25 and 26 have the same size (the ratio between the channel width to the channel length) as the MOS transistors 28–31 constituting the differential stages in the latch circuit LT6. When the feedback signal is set to an L level, it is necessary to flow a current constantly through the MOS transistors 25 and 26 when the associated current source transistors 41 and 42 are made conductive. The MOS transistors 28–31 have the same size (the ratio between the channel width and the channel length). The source voltages of the MOS transistors 28–31 are made high by the resistance elements 36 and 37, to ensure a larger amount of current to flow through the MOS transistors 25 and 26 by the division ratio switching signal SEL to set the feedback signal FBB to the L level.

In this case, however, current flows through the MOS transistors 28 and 30 when the MOS transistors 41 and 42 are made conductive. Therefore, the amplitude of the feedback signals FBB becomes small. In order to make the amplitude of the feedback signal FBB adequately large and to set the feedback signal FBB reliably to an L level, it is necessary to make the resistance values of the resistance elements 11a and 11f large. Thus, a problem that speed performance is lowered arises. Since the source voltages of the MOS transistors 28–31 are made high with the resistance elements 36 and 37, the MOS transistors 28–31 do not correctly operate if the voltage level of the power supply voltage VDD is lowered. Thus, there arises a problem that the power supply voltage VDD cannot be lowered, resulting in a difficulty in reducing the power supply voltage.

The following problem would also be caused. When the amplitude of the feedback signals FBA and FBB is made large for transference, it takes much time to charge and discharge a feedback path so that propagation delay in this path becomes large. As a result, a frequency divider that can operate at a high speed cannot be implemented.

SUMMARY OF THE INVENTION

An object of the present invention is to provide a variable frequency divider circuit that operates stably at high speed with a low consumption power and is superior in noise immunity.

Another object of the present invention is to provide a variable frequency divider circuit, suitable for the CMOS process, operates stably at a high speed.

The variable frequency divider circuit according to the present invention includes: a plurality of latch circuits cascaded in K stages, with K being an integer of 3 or more, each for performing transfer and latch in accordance with a divided signal; and a mode setting transistor for fixing the voltage level of an output signal of the K-th stage latch circuit in response to a mode setting signal. The K-th stage latch circuit and the (K-2)-th latch circuit feed back each output signal to the first stage latch circuit among the latch circuits of K stages. The mode setting transistor has a larger current driving capability than that of transistors for driving a feedback path (FBB) of the K-th stage latch circuit.

The variable frequency divider according to a second aspect of the present invention includes: latch circuits of K stages with K being an integer of 3 or more, each for performing transference and latching in accordance with an input signal; and a mode setting transistor for fixing a voltage level of differential output signals of a K-th stage latch circuit in response to a mode setting signal. Each of the K-th stage latch circuit and the (K-2)-th latch circuit feeds back differential output signals to the first stage latch circuit.

The variable frequency divider according to a third aspect of the present invention includes: latch circuits, cascaded in K stages with K being an integer of 3 or more, each for performing transference and latching in accordance with an input signal; and a mode setting transistor for fixing a voltage level of differential output signals of a K-th stage latch circuit in response to a mode setting signal. Each of the K-th latch circuit and the (K-2)-th latch circuit feeds back differential output signals to the first stage latch circuit among the cascaded latch circuits. The mode setting transistor has a larger current driving capability than that of transistors for driving a feedback path of the K-th stage latch circuit.

The variable frequency divider according to a fourth aspect of the present invention includes: latch circuits, cascaded in K stages with K being an integer of 3 or more, each for performing transference and latching in accordance with an input signal. Each of the K-th stage latch circuit and the (K-2)-th stage latch circuit feeds back differential output signals to the first stage latch circuit among the cascaded latch circuits. A circuit section for outputting the feedback output signals of the K-th and (K-2)-th stage latch circuits is arranged adjacently to an area where the first stage latch circuit is arranged.

By making the current driving capability of the mode setting transistor for switching the division ratio larger than that of the transistors for driving the feedback path, a larger amount of current can flow constantly through the mode setting transistor than the feedback path driving transistors when the mode setting transistor is rendered conductive. Thus, the voltage level of feedback signals can be reliably set to a desired level.

By using differential signals as the feedback signal, the amplitude of the feedback signal can be made adequately large and the feed back signal can be transferred to the first stage latch circuit even when the feedback signal is a single end feedback signal having a small amplitude. Thus, the feedback signal having a small amplitude can be correctly transferred under a low power supply voltage condition.

Moreover, by combining these aspects, a frequency divider that operates stably at a high speed with a low consumption current, can be realized.

By arranging circuits for transmitting and receiving the feedback signal adjacently to each other, the length of the feedback path can be made short. Additionally, the feedback signal can be transferred at a high speed and current for driving the feedback path can be reduced. Thus, a frequency divider that operates at a high speed with a low consumption current, can be realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
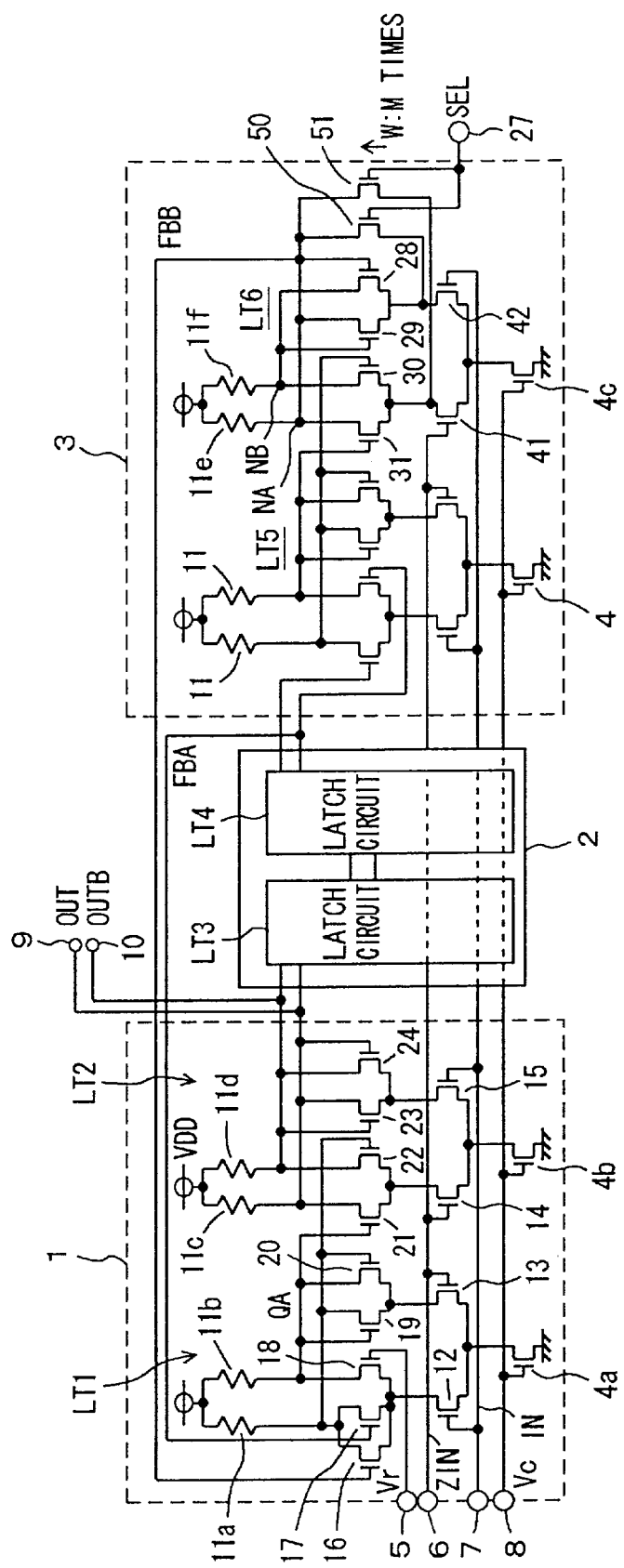
FIG. 1 is a circuit diagram of a variable frequency divider according to a first embodiment of the present invention.

FIG. 1 is a circuit diagram of a variable frequency divider according to the first embodiment of the present invention. In FIG. 1, a flip-flop 2 for generating a feedback signal FBA is the same in internal structure as the conventional flip-flop 2 shown in FIG. 13. As for the flip-flop 2, only blocks of latch circuits LT3 and LT4 are shown. The shown frequency divider can have its division ratio changed between 1/4 and 1/5.

In the frequency divider shown in FIG. 1, current driving capability of MOS transistors 50 and 51 for changing its division ratio for generating a feedback signal FBB is set to a value M times greater than that of the other MOS transistors 28–31 in a flip-flop 3, where M satisfies the condition of M>1.

The source of the MOS transistor 50 is connected to the sources of the MOS transistors 28 and 29 constituting a differential stage, and the source of the MOS transistor 51 is also connected to the sources of the MOS transistors 30 and 31 constituting a differential stage. Therefore, a latch circuit LT6 is not provided with a resistance element for making the source voltages of the MOS transistors 28–31 higher when the MOS transistors 42 and 41 are made conductive. In other words, source nodes of the MOS transistors 50, 28 and 29 are connected together to each other to receive the same voltage. The source of the MOS transistor 51 is also interconnected to the sources of the MOS transistors 30 and 31 so that these sources are at the same voltage level.

Figure 13:
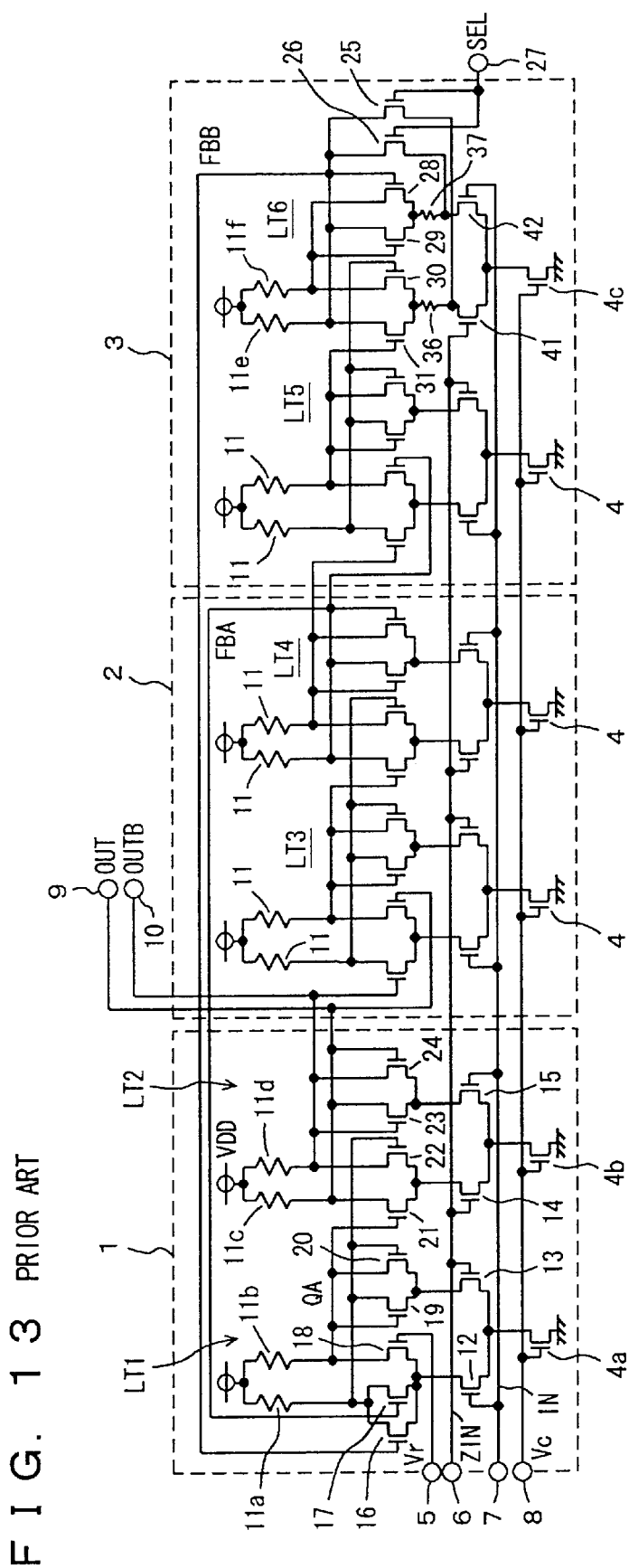
FIG. 13 is a circuit diagram of a conventional variable frequency divider.
Figure 14:
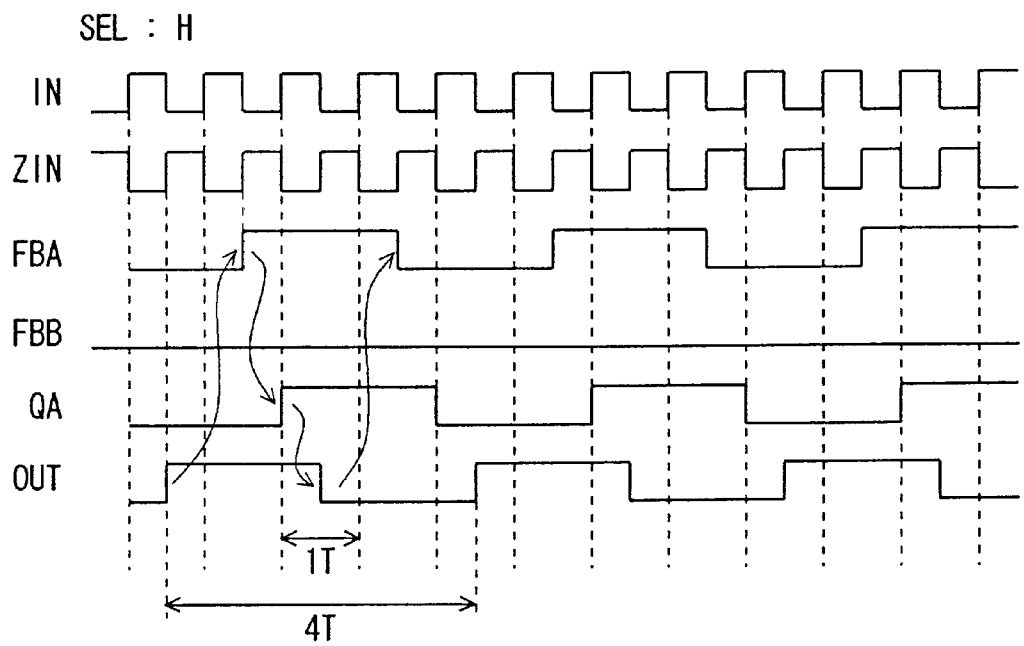
FIG. 14 is a timing chart representing an operation of the variable frequency divider shown in FIG. 13.
Figure 15:
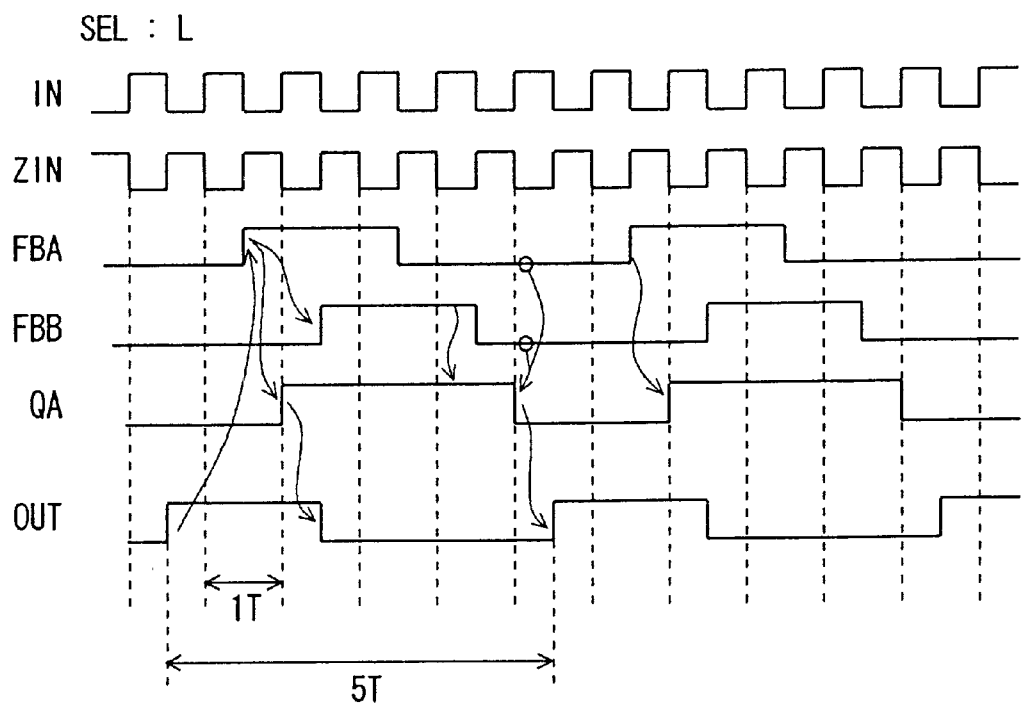
FIG. 15 is a timing chart representing another operation of the variable frequency divider shown in FIG. 13.

The frequency divider according to the present invention has the same structure as the conventional frequency divider shown in FIG. 13, except that the MOS transistors 50 and 51 having a large current driving capability are used instead of the MOS transistors 26 and 25, for changing a division ratio, in the conventional frequency divider. In the inventive and conventional frequency dividers, the same reference numerals are attached to the corresponding components, and the explanation thereof is omitted.

When the division ratio switching signal SEL is at an H level, the MOS transistors 50 and 51 cause a current flow, regardless of the voltage level of the output signals of the latch circuit LT5. When the MOS transistors 42 and 41, current sources for the latches, cause a current flow, current flows constantly through the path formed of the MOS transistors 50 and 51. Therefore, current flows constantly through a node NA so that the voltage at the node NA is set fixedly to an L level. Thus, the feedback signal is fixed to an L level. In this case, frequency dividing operation is performed by the flip-flops 1 and 2 of the two stages in the same way as in a conventional divider, so that the dividing operation provides a division ratio of 1/4.

On the other hand, when the division ratio switching signal SEL is set to an L level, the MOS transistors 50 and 51 turn off since the respective pairs of MOS transistors 30 and 31 and of the MOS transistors 28 and 29 each constitute "source coupled logic". Thus, no current flows through the MOS transistors 50 and 51, and the node NA and a node NB are charged and discharged in accordance with the output signals of the latch circuit LT5. As a result, the feedback signal FBB changes in accordance with the complementary output signals of the latch circuit LT5. In this case, both of the feedback signals FBA and FBB from the flip-flops 2 and 3 become effective and are fed back to the flip-flop 1. Consequently, this frequency divider operates as a 1/5-frequency divider, as the dividing operation thereof is the same as in the frequency divider shown in FIG. 13.

Now it is suppose that division ratio switching signal SEL is set to an H level equal to, for example, the power supply voltage VDD. In this state, the size (channel width W) of the MOS transistors 50 and 51 is set M times larger than the size of the MOS transistors 28–31. Even if the gate to source voltage of the MOS transistors 50 and 51 is the same as that of the MOS transistors 28–31, current constantly flows from the power node to the current source transistor 4c through the resistance element 11e and the MOS transistor 50 or 51.

When a signal at an H level is supplied to the gate of the MOS transistor 31, the gate to source voltage of the MOS transistors 31 and 51 is the same. However, the amount of the current flowing through the MOS transistor 51 is M times larger than that flowing through the MOS transistor 31. Substantially all the current flows through the MOS transistor 51.

Conversely, when a signal at an H level is supplied to the MOS transistor 30, current of an amount larger M times greater in amount than the current flowing through the MOS transistor 30 flows through the MOS transistor 51. Thus, almost all of the current determined by the current source 4c flows through the MOS transistor 51. Therefore, the node NA is kept at an L level regardless of the logic levels of the output signals of the latch circuit LT5.

When the node NB is at an H level, the node NA is at an L level. Thus, in the MOS transistors 28 and 29, a great amount of current flows through the MOS transistor 29. In this case, the MOS transistor 50 is in an on state in accordance with the division ratio switching signal SEL at an H level. The size of the MOS transistor 50 is M times as large as that of the MOS transistor 29. Almost all of the current determined by the current source 4c flows through the MOS transistor 50. Therefore, the current determined by the current source 4c constantly flows from node NA through the MOS transistor 50 or 51, so that the node NA is kept at the L level.

The drain current Ids of a MOS transistor in a saturation region is generally represented by the following expression:

$$Ids = \beta(Vgs - Vth)(Vgs - Vth)/2, \ \beta(W/L) \cdot \mu \cdot C0$$

where W and L represent the channel width and the channel length of the MOS transistor, respectively; $\mu$ represents charge mobility; and C0 represents gate capacitance.

Therefore, when the channel width W is, for example, doubled, the drain current Ids is doubled under the condition that the gate to source voltage is the same. To cause current to flow constantly through a MOS transistor for changing a division ratio, the resistance elements 36 and 37 are conventionally used as shown in FIG. 13, to make the gate to source voltage Vgs of the division ratio changing MOS transistor greater than that of transistors in the differential stages.

However, in the case that a current amount is adjusted through the gate to source voltage Vgs, the following relation holds. When the drain current Ids is, for example, doubled, it is necessary that the gate to source voltage Va of the division ration changing MOS transistor at least satisfies the following relation:

$$Va \geq (\sqrt{2}) \cdot Vb - ((\sqrt{2}) - 1) \cdot Vth$$

where Vb represents the gate to source voltage of the MOS transistor receiving an H level at a gate thereof, among a pair of MOS transistors in the differential stage.

Therefore, in order to generate a large voltage difference Va−Vb by the resistance elements 36 and 37, it is necessary to make current driven by the current source transistor 4c large or make the resistance values of the resistance elements 36 and 37 shown in FIG. 13 sufficiently large. If such resistance elements are used to raise the source voltages of the MOS transistors 28–31, the latch circuit LT6 cannot be stably operated while satisfying this condition of the source voltages being sufficiently, when the source voltage VDD is made low, which provide a serious damage against the structure for low power consumption and low power supply voltage.

As shown in FIG. 1, however, by making the size (channel width) of the division ratio changing MOS transistors 50 and 51 greater than the size of the other MOS transistors in the differential stages, the feedback signal FBB can be reliably set to an L level. The frequency divider according to the present invention is stably operated to set the feedback signal FBB to an L level even under a low power supply voltage without using any resistance element. A frequency divider which can stably operate at a low power consumption and a low power supply voltage can be achieved without increasing the amount of current driven by the current transistor 4c.

When this frequency divider is operated with a division ratio of 1/5, the division ratio switching signal SEL is set to an L level. L level of the division ratio switching signal SEL is merely required to be such a voltage level that the gate to source voltage Vgs of the MOS transistors 50–51 is made smaller than the threshold voltage Vth of the MOS transistors 50 and 51, and is not particularly required to be set to the level of the ground voltage. Even if the channel width is made large to make the current driving capability large under this condition, the division ratio changing MOS transistors 50 and 51 are off. Thus, the output signal FBB of the latch circuit LT6 changes in accordance with the output signals of the latch circuit LT5, to perform 1/5-frequency dividing operation in the same way as the divider shown in FIG. 13.

As described above, according to the first embodiment of the present invention, the size (the ratio of the channel width to the channel length) of the division ratio changing MOS transistors is made larger than that of the MOS transistors in the associated differential stage. Therefore, when the division ratio changing MOS transistors is made conductive, current is caused to flow constantly through the frequency divider. Thus, it is possible to realize a variable frequency divider that operates stably with a low power consumption even under a low power voltage condition.

The sources of the division ratio changing MOS transistors and those of the transistors in the differential stages are connected together, so that resistance elements for offsetting the source voltage of the transistors in the differential stages are unnecessary. Thus, the transistors in the differential stages can be stably operated even under a low power supply voltage condition.

Second Embodiment

Figure 2:
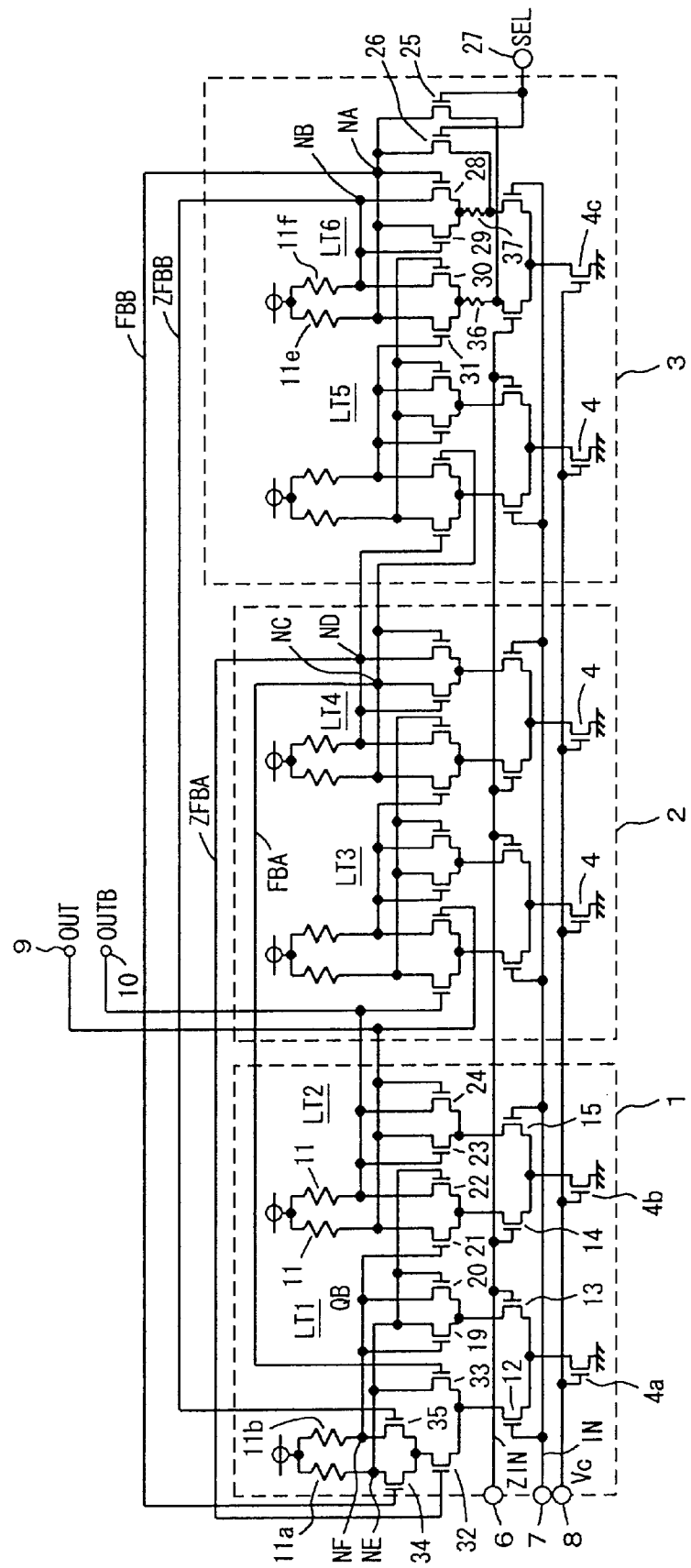
FIG. 2 is a circuit diagram of a variable frequency divider according to a second embodiment of the present invention.

FIG. 2 is a circuit diagram of a variable frequency divider according to the second embodiment of the present invention. In the frequency divider shown in FIG. 2, differential feedback signals FBA and ZFBA, and FBB and ZFBB are supplied from the flip-flops 2 and 3 to the first stage flip-flop 1. The flip-flops 2 and 3 are the same in internal structure as the conventional flip-flops 2 and 3 shown in FIG. 13, and the same reference numbers are attached to the corresponding components. The feedback signals FBA and ZFBA are outputted from internal nodes NC and ND of the flip-flop 2. The feedback signals FBB and ZFBB are outputted from internal nodes NA and NB of the flip-flop 3.

The flip-flop 1 is different in an input section from the conventional flip-flop 1 shown in FIG. 13, in order that the flip-flop 1 can receive the differential feedback signals FBA, ZFBA, FBB and ZFBB. Specifically, a latch circuit LT1 at an input stage in flip flop 1 includes: a resistance element 11 connected between a power node and a node NE; a resistance element 11b connected between the power node and a node NF; an N channel MOS transistor 34 having a drain connected to the node NE and a gate receiving the feedback signal FBB; an N channel MOS transistor 35 having a drain connected to the node NF, a gate receiving the complementary feedback signal ZFBB and a source connected to the source of the MOS transistor 34; an N channel MOS transistor 32 having a drain connected to the common source node of the MOS transistors 34 and 35 and a gate receiving the feedback signal ZFBA; an N channel MOS transistor 33 having a drain connected to the node NE, a gate receiving the feedback signal FBA and a source connected to the source of the MOS transistor 32; an N channel MOS transistor 12 having a drain connected to the common source node of the MOS transistors 32 and 33 and a gate receiving an input signal IN supplied through a terminal 7; differential transistors 19 and 20 for latching the voltages at the nodes NE and NF; an N channel MOS transistor 13 connected to the common source node of the MOS transistors 19 and 20 and a gate receiving an input signal ZIN from a terminal 6; and an N channel MOS transistor 4a connected to the common source node of the MOS transistors 12 and 13 and a gate receiving a constant voltage Vc from a terminal 8.

MOS transistor 19 has its gate connected to the node NF, and its drain connected to the node NE, and its source connected to the source of the MOS transistor 20. MOS transistor 20 has its gate connected to the node NE and its drain connected to the node NF.

In the latch circuit LT1, the reference voltage Vr for criterion for the H level and the L level of the input signals IN and ZIN is not used. An internal transfer signal QB is generated and transferred in accordance with the feedback signal FBA and ZFBA, or FBB and ZFBB to generate output signals OUT and OUTB and the feedback signals FBA, ZFBA, FBB and ZFBB. Now, the operation of the frequency divider shown in FIG. 2 will be descried with reference to the timing charts shown in FIGS. 3 and 4.

Figure 3:
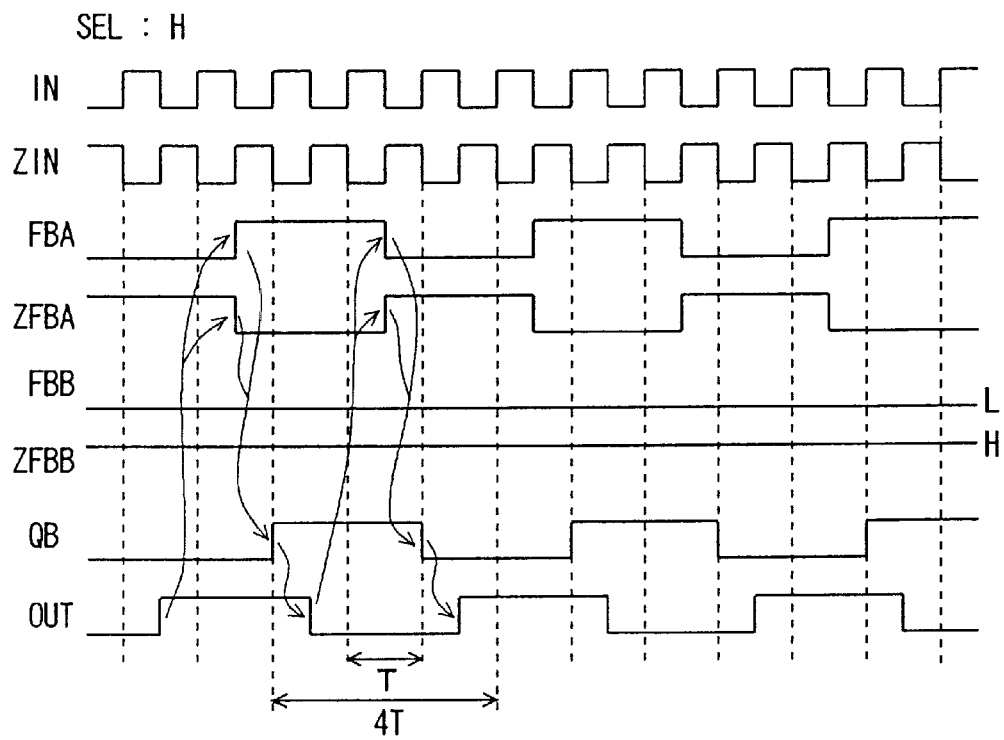
FIG. 3 is a timing chart representing an operation of the variable frequency divider shown in FIG. 2.

Referring to the timing chart shown in FIG. 3, the operation in the case that the division ratio switching signal SEL is set to an H level will be described first. The division ratio switching signal SEL is at an H level of, for example, the power supply voltage VDD so that the MOS transistors 25 and 26 are kept on. The complementary feedback signals FBB and ZFBB are generated from the nodes NA and NB, and are then transferred to the flip-flop 1. Even if the amount of current flowing through the MOS transistors 25 and 26 is small, a voltage difference between the feedback signals FBB and ZFBB is sufficiently large and the feedback signals FBB and ZFBB are reliably set to an L level and an H level, respectively.

In the first stage flip-flop 1, the gates of the MOS transistors 34 and 35 receive the feedback signals FBB and ZFBB, respectively. Accordingly, in transfer operation of the latch circuit LT1, a lager amount of current flows through the MOS transistor 35. In the case in which the reference voltage Vr is used, the amplitude upon determining an H- or an L-level is (VH–Vr) or |VL–Vr|, where VH and VL represent voltages of the H level and the L level of the feedback signal FBB, respectively. On the other hand, in the case in which the differential feedback signals FBB and ZFBB are used, the amplitude upon determining an H- or an L-level is constantly (VH–VL). When the voltage level of the reference voltage Vr is (VH–VL)/2, and the differential feedback signals are used, it is possible to obtain equivalently a signal having a doubled amplitude of a single end signal. Even if the single end signal is a signal of a small amplitude, the H/L level can be correctly determined.

When the input signal IN is at an H level and the feedback signals FBA and ZFBA are at L and H levels, respectively, a larger amount of current flows through the MOS transistor 32 than that through the MOS transistor 33. This MOS transistor 32 functions as an current source transistor for the MOS transistors 34 and 35, so that the signal QB of the node NF is kept at an L level.

When the input signal IN falls down to an L level, the MOS transistor 14 turns on in response to the transition of the input signal IN to the L level. The latch circuit LT2 takes in the internal signal QB and latches it. Accordingly, the output signal OUT attains an H level in accordance with the signal QB of the L level. The output signal OUT of the latch circuit LT2 is transferred to the flip-flop 2 in accordance with the input signal IN. Consequently, the feedback signal FBA attains an H level and the complementary ZFBA attains an L level after one cycle of the input signal IN from the transition of the output signal OUT into an H level.

When the feedback signal FBA is at the H level, a larger amount of current flows through the MOS transistor 33 than that through the MOS transistor 32 so that the node NE is driven to an L level. Since substantially no current flows through the MOS transistor 32, the node NF is drive to an H level, so that the internal signal QB changes into an H level in response to the transition of the input signal IN into an H level.

The change of the internal signal QB is transferred through the latch circuit LT2 in accordance with the input signals IN and ZIN, so that the output signal OUT attains an L level in response to the change of the input signal IN into the H level. Thereafter, a signal delayed by one cycle of the input signal IN relative to this output signal is generated from the flip-flop 2 and is then fed back to the flip-flop 1. Therefore, the output signal OUT has a period, 4·T, which is four times the period T of the input signal IN. That is, a frequency divider having a division ratio of 1/4 can be implemented by the flip-flops 1 and 2.

In other words, by setting the feedback signal FBB and the complementary feedback signal ZFBB to L and H levels, respectively, in accordance with the division ratio switching signal SEL, the node NE or NF is selectively discharged by the MOS transistor 32 or 33 in accordance with logic levels of the feedback signals FBA and ZFAB. Thus, a frequency divider having a division ratio of 1/4 can be achieved since the voltage levels of the internal nodes NE and NF are determined by the feedback signals FBA and ZFBA and the feedback signals FBB and ZFBB exerts no effect on the logic level of the transfer signal QB of the flip-flop 1.

In the flip-flop 3, the division ratio setting MOS transistors 25 and 26 have the same size as the MOS transistors 28–31 constituting the differential stages. The resistance elements 36 and 37 are provided. When current flows through the resistance elements 36 and 37, the gate to source voltage Vgs of the MOS transistors 25 and 26 is higher than the gate to source voltage of the MOS transistor receiving, at a gate, an H level signal, among the MOS transistors 28–31, by a voltage drop across the resistance elements 36 and 37. Accordingly, the largest amount of current flows constantly through the MOS transistor 25 or 26 to discharge the node NA. The total amount of the discharged current from the node NA and the discharged current from the node NB is determined by the current transistor 4c. Thus, the voltage level of the node NA is constantly lower than that of the node NB. In other words, the feedback signal FBB from the node NA and the complementary signal ZFBB from the node NB are constantly at L and H levels, respectively. Therefore, even when the resistance values of the resistance elements 11e and 11f are small and the driving current amount of the current source transistor 4c is small, a voltage difference between the differential feedback signals FBB and ZFBB can be made sufficiently large. As a result, feedback signals can be correctly generated without any influence due to noises, to be transferred to the first stage flip-flop 1. Thus, it is possible to achieve a frequency divider that operates stably with a low power consumption and has a higher noise immunity.

Moreover, the respective amplitudes of the feedback signals FBA, ZFBA, FBB and ZFBB can be made small, and the feedback signals can be transferred at a high speed. The effect of the feedback path on operation speed can be made small, and the speed performance of the frequency divider can be improved.

Figure 4:
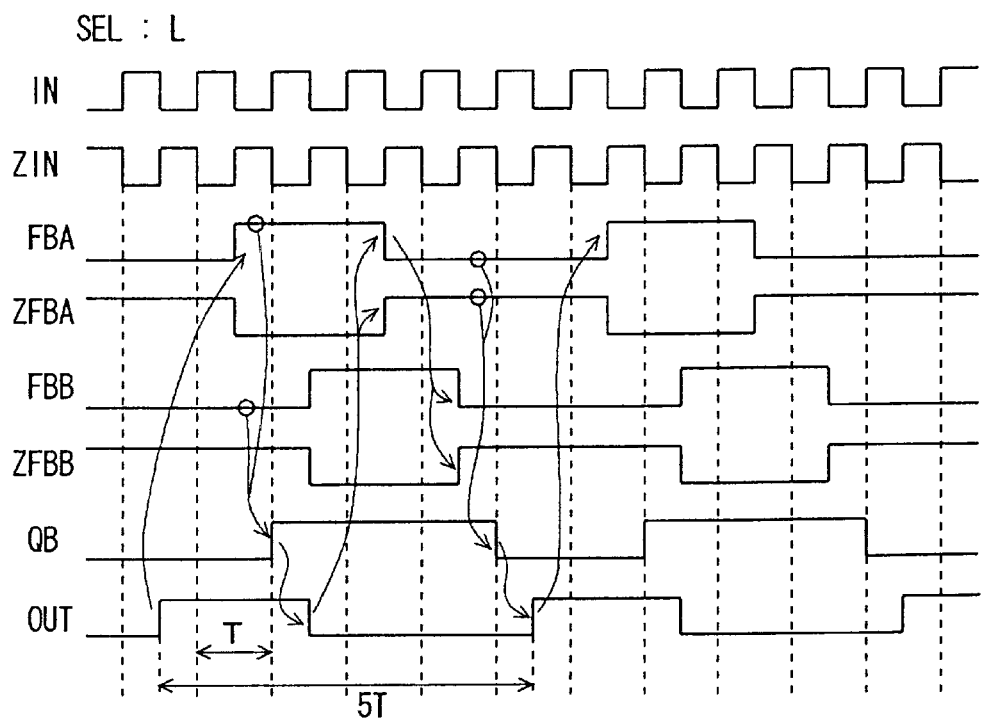
FIG. 4 is a timing chart representing another operation of the variable frequency divider shown in FIG. 2.

Referring to FIG. 4, the operation in the case that the division ratio switching signal SEL is set to the voltage level at which the gate to source voltage Vgs of the MOS transistors 25 and 26 does not exceed the threshold voltage Vth of the MOS transistors 25 and 26, will be described. In this case, the MOS transistors 25 and 26 are kept off regardless of the voltage level of the output signals of the latch circuit LT5, and the feedback signals FBB and ZFBB from the nodes NA and NB change in accordance with the transfer/latch signals of the latch circuit LT5 and LT6.

Now, it is supposed that both of the feedback signals FBA and FBB are both at L levels. When the input signal IN rises up to an H level in this state, the internal signal QB in the flip-flop 1 is kept at an L level in the same way as in the frequency 1/4-dividing operation. When the input signal IN attains an L level in the state that the internal signal QB is at the L level, the output signal OUT rises up to an H level by the transfer/latch operation of the latch circuit LT2. When the output signal OUT rises up to the H level, the feedback signal FBA rises up to an H level with delay of one cycle of the input signal IN. When the feedback signal FBA rises up to the H level, the feedback signal FBB rises up to an H level with delay of one cycle of the input signal IN.

When the feedback signal FBA is at an H level and the feedback signal FBB is at an L level, the MOS transistor 33 receiving, at a gate thereof, the feedback signal FBA in the latch circuit LT1 in the flip-flop 1 pulls out current, and MOS transistor 32 hardly causes a current flow. Responsively, the internal signal QB attains an H level. When the input signal ZIN attains an H level, the internal signal QB at the H level is taken in and latched by the latch circuit LT2. Consequently, the output signal OUT changes to an L level with delay of one cycle of the input signal IN relative to the internal signal QB.

Even if the feedback signal FBA falls down to an L level with delay of one cycle of the input signal IN from the falling of the output signal OUT, the feedback signal FBB is still at the H level. In the latch circuit LT1, a larger amount of current flows through the MOS transistor 32 receiving, at a gate thereof, the feedback signal ZFBA, and current hardly flows through the MOS transistor 33. The feedback signal FBB is at the H level, and the MOS transistor 34 is rendered conductive, and the MOS transistor 35 is hardly rendered conductive. Therefore, the internal signal QB is kept at the H level.

When the feedback signal attains an L level and both of the feedback signals FBA and FBB attains L levels, the MOS transistor 35 receiving, at a gate thereof, the feedback signal ZFBB pulls out current from the node NF. Thus, the internal signal QB is driven to an L level so that the output signal OUT attains an H level in response to the rise of the complementary input signal ZIN.

Accordingly, the H level period of the output signal OUT corresponds to two cycles of the input signal IN and the L level period thereof corresponds to three cycles of the input signal IN. Thus, a frequency divider having a period 5T, which is five times the period T of the input signal IN, and having a division ratio of 1/5 is achieved.

When the feedback signal FBA is at an H level in the latch circuit LT1, the MOS transistor 33 performs discharging operation and the internal signal QB is kept at an H level regardless of the logic levels of the feedback signals FBB and ZFBB. When the feedback signal FBB is at an H level, the internal node NE is discharged by the MOS transistor 32 or 33 regardless of the logic level of the feedback signal FBA so that the internal node NE attains an L level. Consequently, the internal signal QB attains an H level. Thus, the internal signal QB is a signal obtained through OR operation on the feedback signals FBB and FBA. Therefore, the frequency divider shown in FIG. 2 performs operation equivalent to that of the conventional frequency divider shown in FIG. 13.

In the case of 1/5-frequency dividing operation, differential signals are supplied as feedback signals to the first stage flip-flop 1. Even if the amplitudes of the single-end feedback signals FBA and FBB are small, the differential stage formed of the MOS transistors 32 and 33 and the differential stage formed of the MOS transistors 34 and 35 each receive a differential feedback signal having a sufficiently large voltage difference. Thus, the differential stages each can perform correct comparing operation to generate the internal signal QB.

Therefore, even if feedback signals of a small amplitude are used, correct frequency dividing operation can be implemented. Current consumption can be reduced owing to no necessity of generating signals of a large amplitude. Moreover, the transmission of signal of a small amplitude makes it possible to transfer feedback signals at a high speed. Thus, a frequency divider that operates at a high speed can be achieved Differential signals are fed back, and therefore, even if noises are generated, the noises are interposed on the differential signals in a common phase. Thus, feedback signals can be correctly transferred without being affected by the noises. As a result, a frequency divider superior in noise immunity can be implemented.

As described above, according to the second embodiment of the present invention, it is possible to achieve a frequency divider that generates differential feedback signals, is superior in noise immunity, and operates at a high speed with a low current consumption.

Third Embodiment

Figure 5:
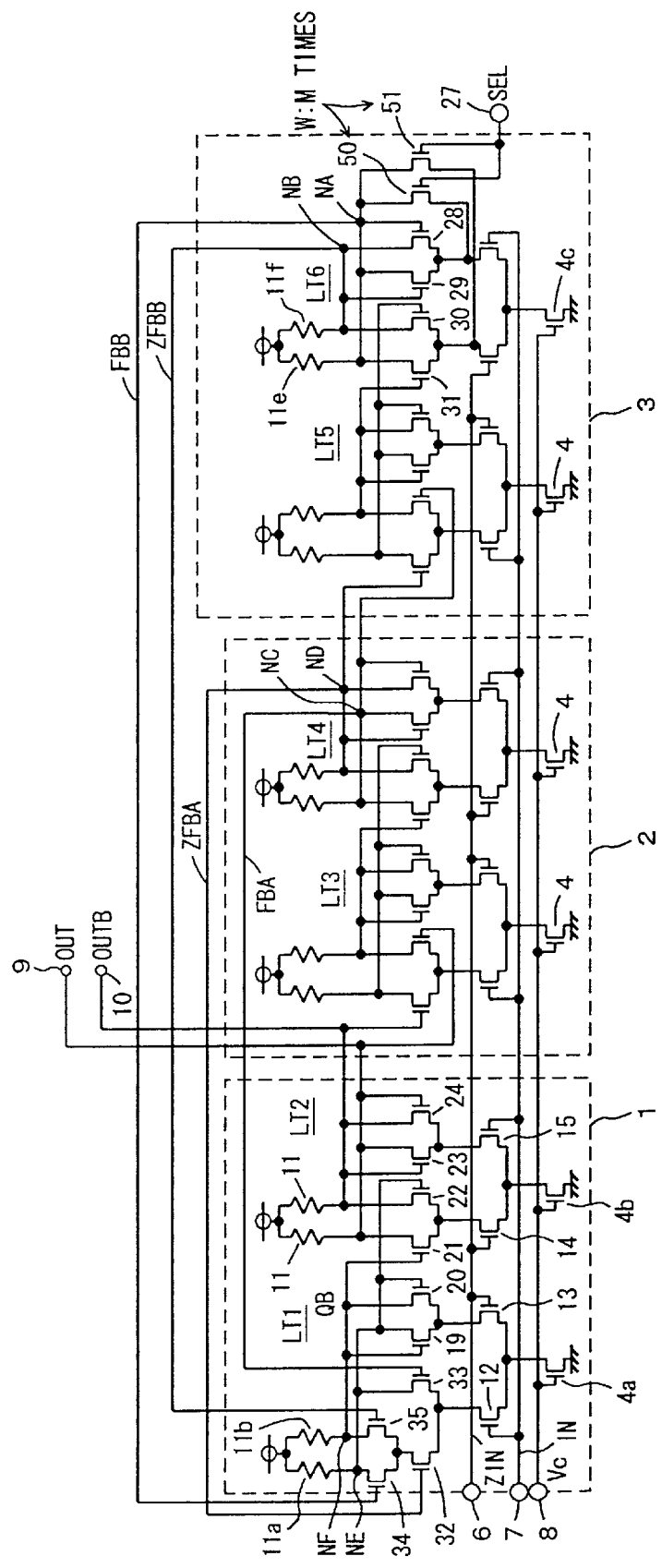
FIG. 5 is a circuit diagram of a variable frequency divider according to a third embodiment of the present invention.

FIG. 5 is a circuit diagram of a frequency divider according to the third embodiment of the present invention. The frequency divider shown in FIG. 5 includes cascaded flip-flops 1–3 of three stages. The flip-flop 1 shown in FIG. 5 is the same in internal structure as the flip-flop 1, shown in FIG. 2, according to the second embodiment. The flip-flop 3 shown in FIG. 5 is the same in the internal structure as the flip-flop 3 in the frequency divider according to the first embodiment, shown in FIG. 1.

Specifically, as to the division ratio switching MOS transistors 50 and 51 in the flip-flop 3, their size (channel width) is made larger than that of the other MOS transistors 28–31 in differential stages, so that their current driving abilities are made large.

From the flip-flops 2 and 3, the differential feedback signals FBA and ZFBA, and FBB and ZFBB are supplied to the latch circuit LT1 in the flip-flop 1. In the frequency divider shown in FIG. 5, the same reference numerals are attached to components corresponding to those in the first and second embodiments, which in turn are shown in FIGS. 1 and 2, and detailed explanation thereof is omitted.

In the frequency divider shown in FIG. 5, the division ratio switching MOS transistors 50 and 51 each have a large current driving capability, so that the feedback signal FBB is reliably set to an L level. The source of the MOS transistor 50 is connected to the common source node of the MOS transistors 28 and 29, and the source of the MOS transistor 51 is connected to the common source node of the MOS transistors 30 and 31, and no resistance element is provided, and therefore, transfer/latch operation can be stably performed even at a low power supply voltage similarly as in the first embodiment.

Differential signals are fed back to be supplied to the flip-flop 1. Thus, even if each of these feedback signals is a small amplitude signal, it is possible to determine the H level and L level of the feedback signals in the latch circuit LT1 in the flip-flop 1. As a result, a frequency divider that is superior in noise immunity and operates at a high speed can be obtained similarly to the second embodiment.

The operation of the frequency divider shown in FIG. 5 is equivalent to the combination of the operations of the dividers shown in FIGS. 1 and 2. In accordance with the division ratio switching signal SEL, 1/4- and 1/5frequency dividing operations can be selectively implemented. The flip-flop 1 shown in FIG. 5 performs the same operation as in the flip-flop 1 shown in FIG. 2. The flip-flop 3 shown in FIG. 5 performs the same operation as in the flip-flop 3 shown in FIG. 1. Thus, an explanation on the operations of the frequency divider shown in FIG. 5 is omitted.

As described above, according to the third embodiment of the present invention, the current driving capability of the division ratio switching MOS transistors is made larger than that of the other MOS transistors in the differential stages, and the sources of these division ratio switching MOS transistors are directly connected to the common source node of the MOS transistors in the differential stages. Moreover, differential signals are fed back. Therefore, it is possible to implement a frequency divider that is superior in noise immunity, and operates stably at a high speed with a low consumption current even under a low power supply voltage condition.

Fourth Embodiment

Figure 6:
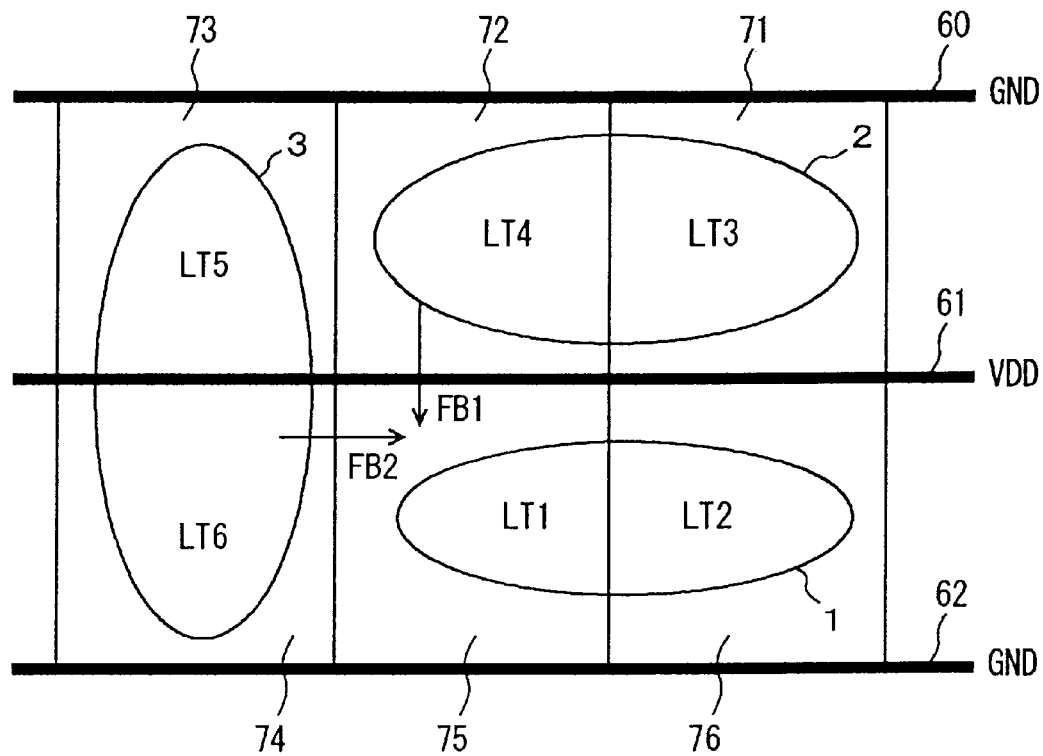
FIG. 6 is a diagram showing a two-dimensional layout of a variable frequency divider according to a fourth embodiment of the present invention.

FIG. 6 is a diagram schematically showing a two-dimensional layout of a variable frequency divider according to the fourth embodiment of the present invention. In FIG. 6, ground lines 60 and 62 for transmitting ground voltage GND are arranged at both sides of a power line 61 for transmitting a power supply voltage VDD and in parallel thereto. The region between the power line 61 and the ground line 60 are divided into three arrangement areas 71–73. The region between the power line 61 and the ground line 62 are also divided into three arrangement areas 74–76. These areas 71–76 have a substantially rectangle shape. In these areas 71–76, latch circuits constituting a frequency divider are arranged, respectively.

Specifically, the latch circuits LT1 and LT2 in the flip-flop 1 are arranged in the arrangement areas 75 and 76, respectively. The latch circuits LT3 and LT4 in the flip-flop 2 are arranged in the arrangement areas 71 and 72, respectively. The latch circuits LT5 and LT6 in the flip-flop 3 are arranged in the arrangement areas 73 and 74, respectively.

The arrangement area 72 where the latch circuit LT4 for generating feedback signal FB1 (FBA, or FBA and ZFBA) is arranged is positioned in the manner that its one side contacts the arrangement area 75 where the latch circuit LT1 for receiving the feedback signal FB1 of the flip-flop 1 is arranged. The arrangement area 74 where the latch circuit LT6 for generating feedback signal FB2 (FBB, or FBB and ZFB) is arranged is positioned in such a manner that its one side contacts the arrangement area 75 where the latch circuit LT1 is arranged.

Therefore, the areas 72 and 75 where the latch circuits for generating the feedback signals FB1 and FB2 are arranged are positioned adjacently to the area 75 where the latch circuit LT1 receiving these feedback signals FB1 and FB2 is arranged. Thus, signal lines for transmitting the feedback signals FB1 and FB2 can be made short, so as to minimize the line capacitance and the line resistance of the feedback signal transmitting lines. Accordingly, the feedback signals FB1 and FB2 can be transmitted at a high speed. Consequently, single or differential feedback signals FB1 and FB2 can be changed at a high speed, and thus, a frequency divider which operates at a high speed can be realized.

The flip-flops 1–3 shown in FIG. 6 may have the same structure as any one of the first to third embodiments. The flip-flops 1–3 may have the same structure as that shown in FIG. 13.

The latch circuits LT1–LT6 is optimally arranged in the corresponding arrangement areas 71–76, considering their area utilization efficiency and positional relationship relative to the power line 61 and the ground lines 60 and 62.

As described above, according to the fourth embodiment of the present invention, the latch circuits for outputting feedback signals are arranged adjacently to the latch circuit for receiving the feedback signals so that the path for transmitting the feedback signals can be made short. Thus, a frequency divider that operates at a high speed can be achieved.

[General Structure]

Figure 7:
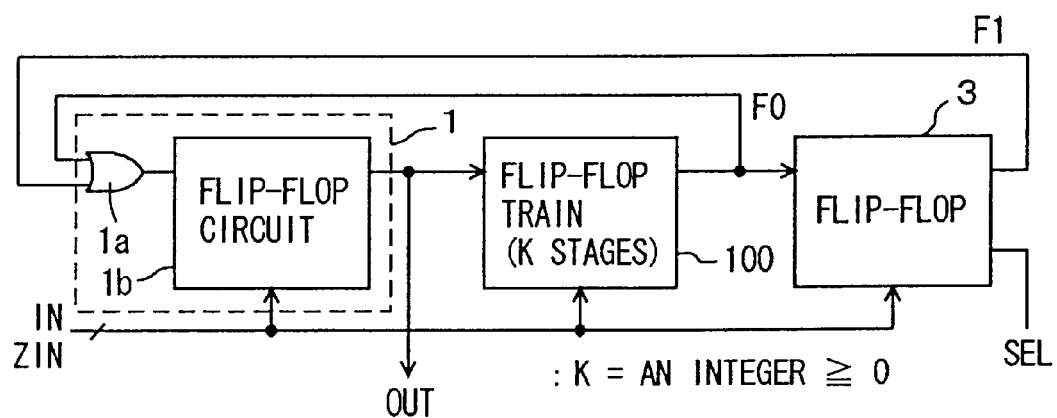
FIG. 7 is a block diagram representing a general structure of the variable frequency divider according to the present invention schematically.

FIG. 7 is a block diagram showing a general structure of the variable frequency divider according to the present invention schematically. In FIG. 7, a train 100 of K flip-flops is arranged between a first stage flip-flop 1 and a last stage flip-flop 3, with K being a non-negative integer. The output signal OUT is outputted from the first stage flip-flop 1. Feedback signal F0 is outputted from the last stage flip-flop of the flip-flop train 100, and feedback signal F1 is outputted from the last stage flip-flop 3. The feedback signals F0 and F1 are fed back to the first flip-flop 1.

The flip-flop 3 inactivates or activates the feedback signal F1 in accordance with the division ratio switching signal SEL. The "inactive" state is the state that the feed back signal is at an L level when the feedback signal F1 is a single end signal. When the feedback signal F1 is formed of differential signals, the "inactive state" is the state that their logic levels does not exert any effect on frequency dividing operation in the flip-flop 1. In the case that the feedback signal F1 includes the signals FBB and ZFBB, the "inactive" state is the state that they are at L and H levels, respectively.

The flip-flop 1 functionally includes an OR circuit 1$a$ for receiving the feedback signals F0 and F1, and a flip-flop circuit 1$b$ for transferring and latching the output signal of the OR circuit 1$a$ in accordance with the input signals IN and ZIN. In the flip-flop 1, the latch circuit LT1 includes the OR circuit 1$a$ as a constituent element. The OR circuit 1$a$ corresponds to a differential pair of MOS transistors for receiving the feedback signals F0 and F1 in the latch circuit LT1. Therefore, the flip-flop circuit 1$b$ includes a part excluding a part functionally corresponding to the OR circuit 1$a$ in the latch LT1, and the latch circuit LT2.

The flip-flop train 100 includes K cascaded flip-flops, and each of these flip-flops transfers a received signal to a subsequent stage with a delay of one cycle of the input signals IN and ZIN. The flip-flops 1 and 3 have the same structure as those in the first to third embodiments.

Figure 8:
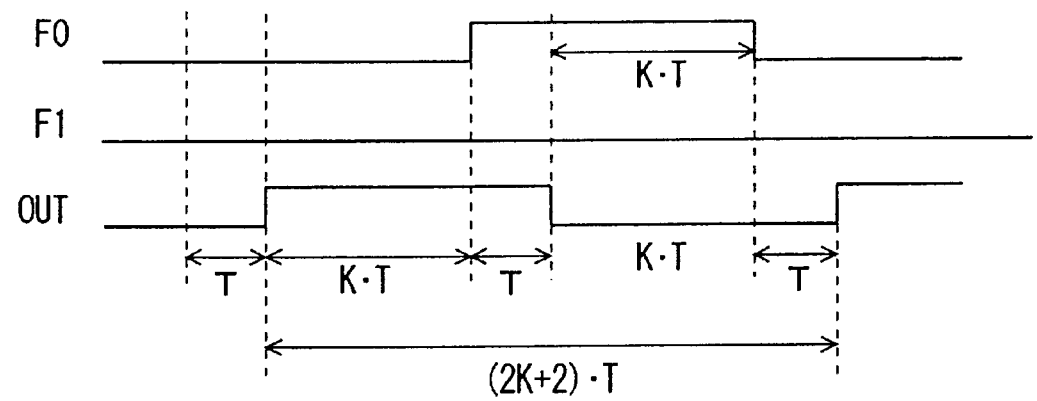
FIG. 8 is a signal waveform chart representing an operation of the variable frequency divider shown in FIG. 7.

In the frequency divider shown in FIG. 7, the flip-flop 3 does not contribute to frequency dividing operation when the division ratio switching signal SEL is set to an H level, and the feedback signal F1 is kept at an inactive state(an L level), as shown in FIG. 8. The flip-flop 1 and the flip-flop train 100 perform frequency dividing operation.

When the feedback signal F0 attains an L level and both of the feedback signals F1 and F0 attain L levels, the output signal of the flip-flop 1 attains an H level after one cycle (period T) of the input signal IN elapses. The flip-flop train 100 successively transfers the output signal OUT in accordance with the input signals IN and ZIN. Consequently, the feedback signal F0 from the flip-flop train 100 attains into an H level after K cycles of the input signal IN elapse.

When the feedback signal F0 attains the H level, the output signal OUT of the flip-flop 1 attains an L level after one cycle of the input signal IN elapses. The change of the output signal OUT is reflected on the feedback signal F0 after the time period K·T elapses so that the feedback signal F0 attains an L level. After the one cycle of the input signal IN elapses from the falling of the feedback signal F0, the output signal attains an H level. In this case, therefore, the output signal OUT has a period (2K+2)·T as shown in FIG. 8, and is a signal having a division ratio of 1/(2K+2) of the input signal IN.

Figure 9:
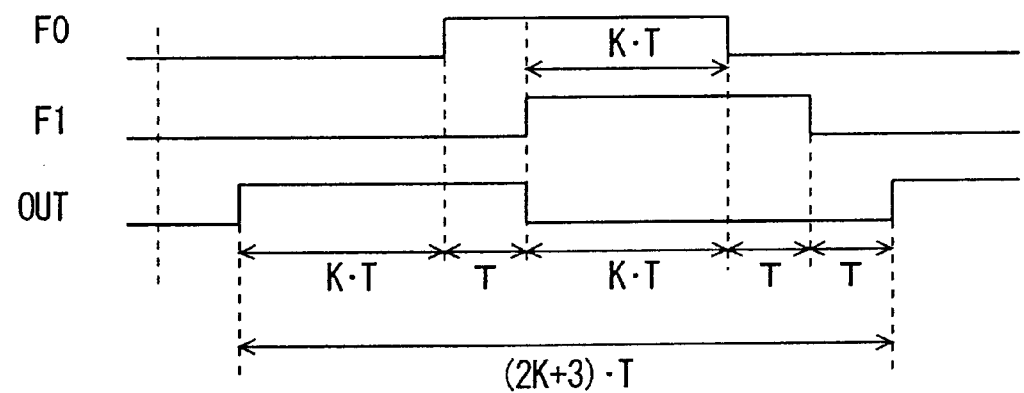
FIG. 9 is a signal waveform diagram representing another operation of the variable frequency divider shown in FIG. 7.

As shown in FIG. 9, when the division ratio switching signal SEL is set to an L level, the feedback signal F1 outputted from the flip-flop 3 is changed in accordance with the feedback signal F0 outputted from the flip-flop train 100. In this case, the feedback signal F1 changes with delay of one cycle of the input signal IN, with respect to the feedback signal F0. Therefore, when both of the feedback signals F0 and F1 are first at an L level, the output signal OUT from the flip-flop 1 is at an H level. After K cycles of the input signal IN elapse, the feedback signal F0 attains an H level. Consequently, the output signal OUT attains an H level and the feedback signal F1 attains an H level after one cycle of the input signal IN elapses.

After K cycles of the input signal IN elapse from the falling of the output signal OUT, the feedback signal F0 attains an L level. At this time, the feedback signal F1 is still at the H level, so that the output signal OUT is kept at the L level. After the one cycle of the input signal IN elapses, the feedback signal F1 attains an L level. As a result, the feedback signal F1 falls. After one cycle of the input signal IN elapses from the change of both the feedback signals F0 and F1 into the L levels, the output signal OUT attains an H level.

Accordingly, in the case that the division ratio switching signal SEL is set to an L level, the output signal OUT has a period (2K+3)·T to provide a frequency dividing signal having a division ratio of 1/(2K+3).

When the number, K, of the flip-flops in the flip-flop train is 1, the division ratio can be switched between 1/4 and 1/5 as described about the first to third embodiments. Thus, by changing the stage number K of the flip-flop train 100 appropriately, divided signals having division ratios of 1/K and 1/(K+1) can be obtained, where K is a natural number.

If the number K is set to 0 in this case, a divided-by-two signal and a divided-by-3 signal can be obtained. Therefore, the stage number K is in general zero or a positive integer.

[Modification]

Figure 10:
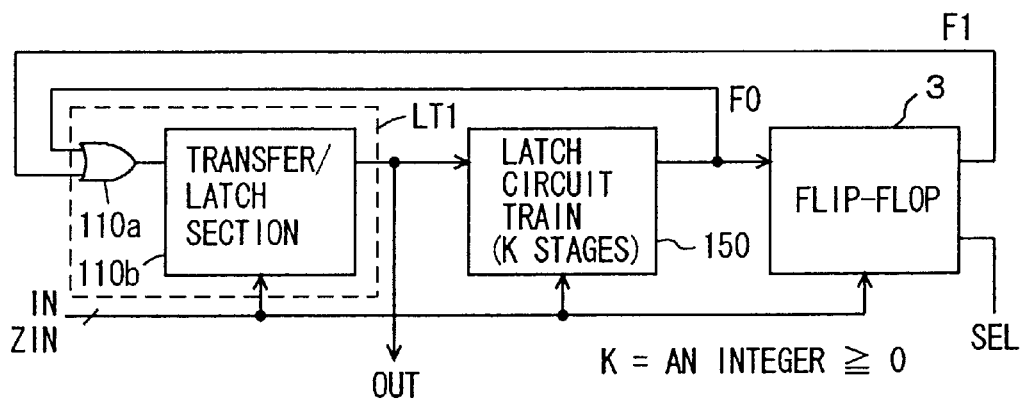
FIG. 10 is a block diagram representing a modification of the variable frequency divider according to the present invention schematically.

FIG. 10 is a block diagram showing a modification of the frequency divider having the general structure. In FIG. 10, this frequency divider includes a first stage latch LT1, a train 150 of cascaded K latch circuits, and a flip-flop 3 for transferring the output signal of the latch circuit train 150. The latch circuit LT1, the latch circuit train 150 and the flip-flop 3 perform transfer and latch operations in accordance with the input signals IN and ZIN. The flip-flop 3 selectively make the feedback signal F1 active or inactive in accordance with the division ratio switching signal SEL. The last stage latch circuit in the latch circuit train 150 also generates feedback signal F0.

The latch circuit LT1 includes an OR circuit 110$a$ for receiving the feedback signals F0 and F1, and a transfer/ latch section 11b for transferring the output signal of the OR circuit 110a in accordance with the input signals IN and ZIN. The latch circuit LT1 has the same structure as that of any one of the latch circuits LT1 described in the first to third embodiments. The latch circuit LT1 generates the output signal OUT. In the latch circuit train 150, the K latch circuits are cascaded, and each of them transfers a received signal to a subsequent stage latch circuit with delay of a half cycle (½ cycle) of the input signal IN.

Figure 11:
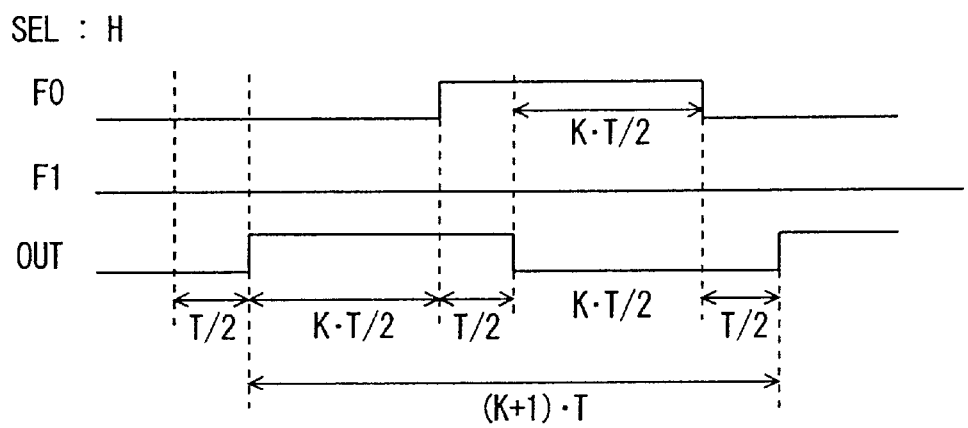
FIG. 11 is a signal waveform diagram representing an operation of the variable frequency divider shown in FIG. 10.

As shown in FIG. 11, if the division ratio switching signal SEL is at an H level in the case of the frequency divider shown in FIG. 10, the feedback signal F1 from the flip-flop 3 is in an inactive state (an L level in FIG. 11) as described in the first to third embodiments. In this state, the feedback signal F0 from the latch circuit train 150 is transferred in accordance with the input signal IN and ZIN. When the feedback signal F0 attains an L level, the output signal OUT rises up to an H level after a delay time (½ cycle) of the latch circuit LT1 elapses.

In the latch circuit train 150, this output signal OUT is transferred during K/2 times the cycle period of the input signal IN. Therefore, the feedback signal F0 attains an H level after the time period K·T/2 elapses from the rise of the output signal OUT. When this feedback signal F0 rises up to the H level and then a half cycle of the input signal IN elapses, the output signal OUT falls down to an L level. After the time period K·T/2 further elapses from the falling of the output signal OUT, the feedback signal F0 falls to an L level so that the output signal OUT attains an H level after a half cycle of the input signal IN elapses. Thereafter, this process is repeated.

Therefore, when the division ratio switching signal SEL is set to an H level, the output signal OUT has a period (K+1)·T as shown in FIG. 11. Thus, a dividing signal having a division ratio of 1/(K+1) can be obtained.

Figure 12:
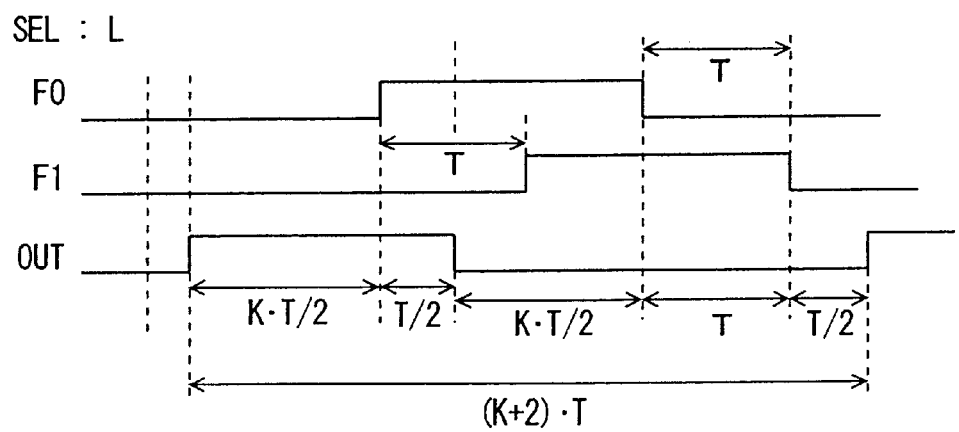
FIG. 12 is a signal waveform diagram representing another operation of the variable frequency divider shown in FIG. 10.

When the division ratio switching signal SEL is set to an L level, as shown in FIG. 12, both of the feedback signals F0 and F1 are made effective. When both of the feedback signals F0 and F1 attain L levels, the output signal OUT of the latch circuit LT1 rises to an H level after a half cycle of the input signal IN elapses. The feedback signal F0 rises to an H level after K·T/2 cycle period of the input signal IN elapses from the rise of the output signal OUT to the H level. In this way, the feedback signal F1 rises to an H level by the flip-flop 3 after one cycle of the input signal IN elapses.

When the output signal of the OR circuit 110a attains an H level, the latch circuit LT1 causes its output signal OUT fall to an L level after a half cycle of the input signal IN elapses. Even if the feedback signal F0 changes into an L level, the feedback signal F1 is kept at the H level. In the next cycle, the output signal OUT is at the L level. When the feedback signal F1 falls to an L level, the output signal of the OR circuit 110a changes into an L level. Therefore, the output signal OUT rises to an H level after a half cycle of the input signal IN elapses. Thereafter, this operation is repeated.

Accordingly, in the case where the division ratio switching signal SEL is set to an L level, the output signal OUT has the period (K+2)·T. A divided signal having a division ratio of 1/(K+2) can be obtained.

In the case where the latch circuit train 150 is omitted, that is, if K is set to zero, a frequency divider that selectively generates a divided signal having division ratio of 1 or 1/2, can be obtained.

Therefore, if the frequency divider is formed using a latch circuit as a unit and the time difference between the feedback signals F1 and F0 at the last stage is one cycle of the input signal IN, a prescaler having a division ratio of F/(F+1) can be realized with F being a natural number.

In the first to fourth embodiments, the respective frequency dividers are composed of MOS transistors. By making this frequency divider utilizing a CMOS process, are fully used to make it is possible to form a frequency divider having a small occupation area and operating at a high speed with a low power consumption, taking full advantages of characteristic feature of CMOS elements. However, the frequency divider may be formed of bipolar transistors in place of MOS transistors.

As described above, according to the present invention, it is possible to realize a high-speed F/(F+1) divider which operates stably with a low power consumption at a high speed and is suitable for the CMOS process.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A variable frequency divider circuit comprising:
cascaded latch circuits of K stages, with the K being an integer of at least three, each for performing transference and latching operation in accordance with a dividend signal, a K-th latch circuit and a (K-2)-th latch circuit each for feeding back an output signal thereof to a first stage latch circuit; and
at least one mode setting transistor for fixing a voltage level of the output signal of said K-th latch circuit in response to a mode setting signal, the mode setting transistor having a larger current driving capability than a current driving capability of transistors for driving a feedback path of said K-th latch circuit to transfer the feed back signal.

2. The variable frequency divider circuit according to claim 1, wherein said K-th latch circuit transfers and latches differential signals in accordance with said dividend signal,
said K-th latch circuit includes a pair of differential transistors receiving said differential signals at their respective gates, and
at least one of said pair of differential transistors is connected to said feedback path, and
said at least one mode setting transistor includes mode setting transistors connected between said feedback path and a current source common to the differential transistor pair.

3. The variable frequency divider circuit according to claim 2, wherein said K-th latch circuit comprises:
a first differential stage for transferring said differential signals in response to said dividend signal; and
a second differential stage, activated complementarily to said first differential stage in response to said dividend signal, for latching output signals for said first differential stage when activated, and said at least one mode setting transistor comprises:
a first selecting transistor, connected to the current source common to differential transistors in said first differential stage, having a larger current driving capability than a current driving capability of said differential transistors in said first differential stage; and
a second selecting transistor, connected to the current source common to said second differential stage, having a larger current driving capability than a current driving capability of differential transistors in said second differential stage.

4. The variable frequency divider circuit according to claim 3, wherein said first selecting transistor and said first differential transistors constitute a source coupled logic, and said second selecting transistor and said second differential transistors constitute another source coupled logic.

5. The variable frequency divider circuit according to claim 1, wherein said feedback path is a path of a single end for transferring a single signal.

6. The variable frequency divider circuit according to claim 1, wherein said feedback path transmits differential signals.

7. A variable frequency divider, comprising:

cascaded latch circuits of K stages, with the K being an integer of at least three, each for performing transference and latching operation in accordance with an input signal, each of a K-th latch circuit and a (K-2)-th latch circuit in the K stages for feeding back differential output signals to a first stage latch circuit in the cascaded latch circuits; and at least one mode setting transistor for fixing voltage levels of the differential output signals of said K-th latch circuit in response to a mode setting signal.

8. The variable frequency divider circuit according to claim 7, wherein said K-th latch circuit comprises:

a first differential stage for transferring differential signals in response to said input signal; and a second differential stage, activated complementarily to said first differential stage in response to said input signal, for latching the differential output signals of said first differential stage when activated, and said at least one mode setting transistor comprises:

a first selecting transistor, connected to a current source common to differential transistors in said first differential stage, having a larger current driving capability than a current driving capability of said differential transistors in said first differential stage; and a second selecting transistor, connected to a current source common to said second differential stage, having a larger current driving capability than a current driving capability of differential transistors in said second differential stage.

9. The variable frequency divider circuit according to claim 8, wherein said first differential stage comprises first differential transistors having sources connected through a first resistance element to a source of said first selecting transistor, and said first resistance element causes a voltage drop from the sources of said first differential transistors to the source of said first selecting transistor, and said second differential stage comprises second differential transistors having sources connected to a source of said second selecting transistor through a second resistance element, and said second resistance element causes voltages at the sources of said second differential transistors to be higher than a voltage at the source of said second selecting transistor.

10. The variable frequency divider circuit according to claim 7, wherein said first stage latch circuit in the cascaded latch circuits of K stages comprises:

first differential transistors for receiving the differential output signals from said K-th latch circuit; and second differential transistors for receiving differential output signals from said (K-2)-th latch circuit, and said second differential transistors comprise:

a first transistor element serving as a current source for said first differential transistors; and a second transistor element having a drain for receiving one of the differential output signals of said first differential transistors, and a source interconnected to a source of said first transistor element.

11. A variable frequency divider comprising:

cascaded latch circuits of K stages, with K being an integer of at least 3, each of a K-th latch circuit and a (K-2)-th latch circuit feeding back differential output signals to a first stage latch circuit in the latch circuits of K stages; and at least one mode setting transistor for fixing a voltage level of the differential output signals of said K-th latch circuit in response to a mode setting signal, said at least one mode setting transistor being greater in current driving capability than transistors of said K-th latch circuit for driving a feedback path to transfer the differential output signals.

12. A variable frequency divider comprising:

cascaded latch circuits of K stages, with the K being an integer of at least 3, each of a K-th latch circuit and a (K-2)-th latch circuit feeding back each respective output signal to a first stage latch circuit in the cascaded latch circuits of K stages; and a circuit section for outputting said feedback output signals of the K-th and (K-2)-th latch circuits being arranged adjacently to an area where said first stage latch circuit is arranged.

13. The variable frequency divider circuit according to claim 12, wherein each of said cascaded latch circuits of K stages transfers and latches signals in accordance with an input signal, a layout area of each of said cascaded latch circuits has a substantially rectangle shape, and the layout area of each of said K-th and (K-2)-th latch circuits is arranged in such a manner that at least one side thereof contacts the layout area of said first stage latch circuit.

* * * * *